United States Patent [19]
Sakai

[11] Patent Number: 5,089,844
[45] Date of Patent: Feb. 18, 1992

[54] IMAGE RECORDING DEVICE

[75] Inventor: Jun Sakai, Nagoya, Japan

[73] Assignee: Brother Kogyo Kabushiki Kaisha, Japan

[21] Appl. No.: 449,578

[22] Filed: Dec. 12, 1989

[30] Foreign Application Priority Data

Dec. 19, 1988 [JP] Japan .......................... 63-164742[U]
Dec. 29, 1988 [JP] Japan .......................... 63-164741[U]

[51] Int. Cl.$^5$ .............................................. G03B 27/32
[52] U.S. Cl. .......................................... 355/27; 355/133
[58] Field of Search .................... 355/27, 28, 133, 218, 355/301, 302, 307; 430/138

[56] References Cited

U.S. PATENT DOCUMENTS 3,598,487  8/1971  Mizuguchi .................. 355/307 X
4,399,209  8/1983  Sanders et al. .................. 430/138

Primary Examiner—L. T. Hix
Assistant Examiner—Khanh Dang
Attorney, Agent, or Firm—Kane, Dalsimer, Sullivan, Kurucz, Levy, Eisele and Richard

[57] ABSTRACT

In a transfer-type image recording device utilizing a recording medium comprising a continuous-form recording sheet and a cut-form developing sheet, the former is arranged to be fed in a predetermined speed, coated with a plurality of photo and pressure sensitive microcapsules each containing a dye-precursor and a component to change the strength thereof when exposed to light. And the latter is designed to be coated with a developer material which is reactable with the dye-precursor. In the image recording device, a visible image is obtained by transferring an image having been formed on the recording sheet onto a surface of the developing sheet. A roller member for peeling off the microcapsules from a surface of the recording sheet after a transfer operation of an image is executed. Thus, any recognizable image on the recording sheet, for example, a visible negative image formed by the remained microcapsules, is erased after the visible image is obtained on the developing sheet.

19 Claims, 3 Drawing Sheets

IMAGE RECORDING DEVICE

BACKGROUND OF THE INVENTION

This invention relates to an image recording device utilizing a so-called transfer-type recording medium comprising a recording sheet on which a latent image corresponding to an image to be recorded is formed and a developing sheet on which a visible image is formed by transferring the image on the recording sheet to a surface of the developing sheet, and more particularly to a device having a function capable of erasing an any image on the recording sheet, for example, a visible negative image corresponding to the latent image having been remained after the visible image is formed.

Conventionally, the transfer-type photo and pressure sensitive recording medium, disclosed in, for instance Japanese Patent Provisional Publication SHO 58-88739 which had been filed by the Mead Corporation (the corresponding U.S. application is U.S. Pat. No. 4899209), has been known. This type of recording medium comprises a recording sheet on which a plurality of microcapsules, each containing a component for changing the rupture strength thereof when exposed to light and a dye-precursor, are coated, and a developing sheet on which a developer material reactable with the dye-precursor is coated.

A latent image corresponding to an image to be developed is primarily formed on the recording sheet, in other words, on a surface of the recording sheet, a figure of an area on which the rupture strength of the microcapsules are changed is determined based upon the image to be developed when the recording sheet is exposed to light. The exposed recording sheet and the developing sheet are pressurized in an overlapped state, and the microcapsules on the recording sheet are crushed in accordance with the figure formed on the recording sheet. Finally, the dye-precursor streamed out the crushed microcapsules react with the developer material to develop a visible image on the developing material sheet.

In this type of image recording device. It is possible to obtain a high-quality visible image with low-cost, than an image obtained by a so-called silver salt photographic system, or a toner image obtained by an electrophotographic system.

However, with the transfer-type image recording device described above, a recognizable image may remain on the recording sheet after the visible image is formed on the developing sheet. For example, a negative image formed by the uncrushed microcapsules is remained on the recording sheet in a visible state. Therefore, it is necessary to cut the recording sheet into pieces of shreds by using a shredder or to incinerate it, if the contents of the image formed on the recording sheet include a confidential matter. Thus, a treatment of the used recording sheet has become troublesome.

SUMMARY OF THE INVENTION

It is therefore an object of the invention to provide an improved image recording device which is capable of erasing the image having been formed on the recording sheet after a developing operation, i.e., a transferring operation of the image from the recording sheet to the developing sheet.

For this purpose, according to the invention, there is provided an image recording device, utilizing a recording medium which comprises a pair of sheets, which comprises:

first image forming means for forming a latent image on a predetermined surface of one of said sheets;

second image forming means for forming a visible image corresponding to the latent image formed by said first image forming means on a predetermined surface of the other of said sheets: and erase means for erasing any image remained on said predetermined surface of said one of said sheets after the visible image is formed on said predetermined surface of said other of said sheets.

DESCRIPTION OF THE ACCOMPANYING DRAWINGS

DESCRIPTION OF THE EMBODIMENTS

Referring to the figures, an embodiment of the present invention is described hereinafter.

Figure 1:
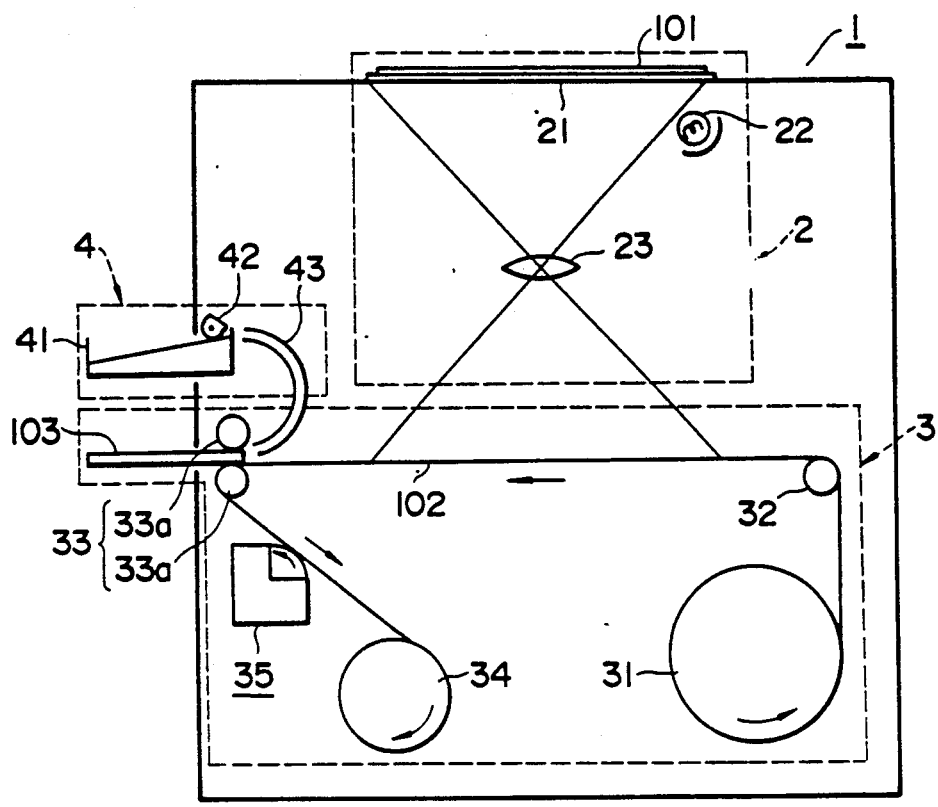
FIG. 1 is a front sectional schematic illustrating an outline of an image recording device embodying the present invention.

FIG. 1 is a front sectional view which shows an outline of an image recording device according to the present invention. In the figure, the mechanism of the image recording device 1 is broken down into an exposure system 2, a photosensitive recording sheet feed system 3, and an image reception sheet feed system 4.

The exposure system 2 is composed of an original table 21 disposed at the center of an upper surface of the device 1, an exposure light source 22 disposed at the lower right of the original table 21 for irradiating a light to an original 101 located on the original table 21, and a lens 23 disposed below the center portion of the original table 21 for focusing the reflected light from a surface of the original 101 on a photosensitive recording sheet 102.

The photosensitive recording sheet feed system 3 is composed of a rewind roller 31 for rewinding the photosensitive recording sheet 102 disposed at the lower right portion in the device 1, a guide roller 32 disposed at the upper portion of the rewind roller 31 for guiding the rewound photosensitive recording sheet 102 from the roller 31, a pair of pressure-developing rollers 33, comprising two rollers 33a, 33a adapted to be brought into and out of contact with each other, for transferring and developing a latent image having been formed on the photosensitive recording sheet 102 at the exposure system 2 onto an image reception sheet 103, described later, an image erasing unit 35 for erasing a negative image which stays on the photosensitive recording sheet 102, and a takeup roller 34 disposed on the opposite side (left side of the figure) of the rewind roller 31 in the lower position of the device 1 for taking up the photosensitive recording sheet 102 from which the image has been transferred onto the surface of the image reception sheet 103. The pressure-developing rollers are disposed at nearly left of the center of the device 1. The image erasing unit 35 is disposed so that it touches the surface of the photosensitive recording sheet 102 in a feed path thereof between the pressure-developing rollers 33 and the takeup roller 34.

The photosensitive recording sheet 102 comprises a continuous-form sheet on which a plurality of microcapsules each containing photosensitive resin and dye-precursor are held on a base material, not shown, by water soluble binders.

The image reception sheet feed system 4 is composed of a cassette unit 41 for housing a plurality of the cut-sheet type image reception sheets 103 in a stuck state, a pickup roller 42 for picking up the image reception sheet 103 located at the top of the stuck sheet 103 one by one from the cassette unit 41, and a sheet guide 43 for guiding the image reception sheet 103 to the pressure-developing rollers 33 disposed below the cassette unit 41. The image reception sheet 103 comprises a developing sheet on which a developer material, reactable with the dye-precursor contained in each microcapsules on the photosensitive recording sheet 102, is coated.

Figure 2:
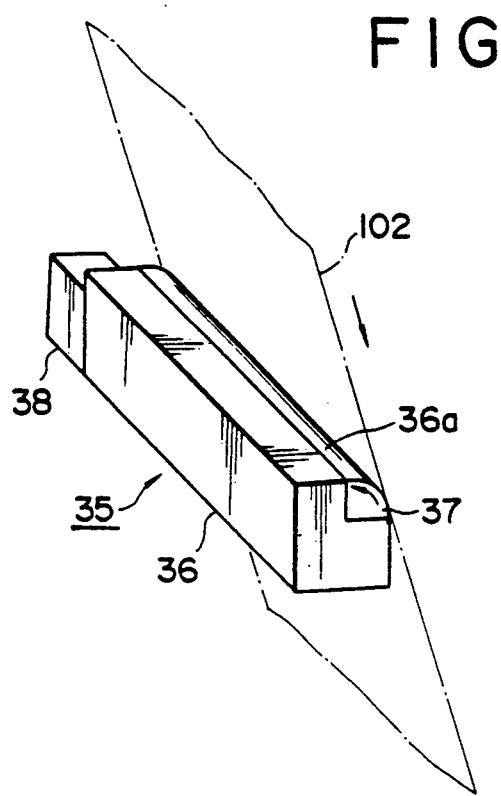
FIG. 2 is an enlarged perspective schematic illustrating an image erasing unit incorporated in the image recording device of FIG. 1.

FIG. 2 is an enlarged perspective view which shows the appearance of the image erasing unit 35 which is the principal section of the present invention.

Figure 3:
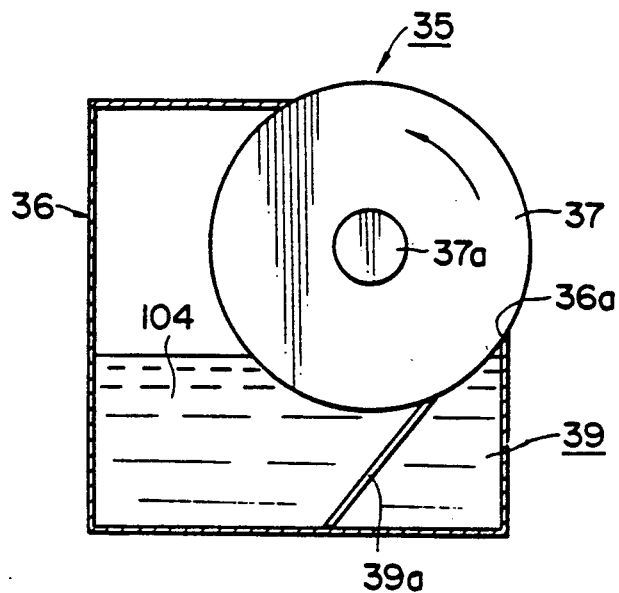
FIG. 3 is an enlarged sectional schematic of the image erasing unit of FIG. 2.

FIG. 3 is an enlarged sectional view of the image erasing unit 35 of the FIG. 2.

As shown in FIG. 2 and 3, on a unit case 36 of the image erasing unit 35, an opening 36a where a part of a water absorption roller 37 as a moist roller is exposed is provided. In addition, at one end of the unit case 36, a drive motor unit 38 incorporating a motor for driving the roller 37 to rotate is disposed. The roller 37 is rotated in a reverse direction (counterclockwise in the figure) of the feed direction of the photosensitive recording sheet 102 in the manner that a rotating force of the drive motor is transmitted to a shaft 37a which rotates in association with the roller 37 through a speed reduction system, not shown.

As shown in FIG. 3, the lower section of the unit case 36 is disposed as a water tank 39. The lower section of the roller 37 is rotated in the manner that it is dipped in water 104 in the water tank 39. In the water tank 39, a blade 39a for peeling off adhesive substance such as microcapsules out of the roller 37 is disposed. The upper end of the blade 39a is arranged to be contacted with a circumferential surface of the roller 37. As the material of the water soluble roller 37, a foaming urethane, a foaming polypropylene, a foaming polyethylene, a foaming polyvinyl chloride, a natural sponge, and the like are preferable.

In the following, an operation of the image recording device 1 according to the above embodiment is described.

In FIG. 1, a light is irradiated from the exposure light source 22. The reflected light from the original 101 on the original table 21 is focused on the photosensitive recording sheet 102 which is rewound from the rewind roller 31 through a lens 23. Consequently, the photosensitive recording sheet 102 is exposed and thereby a latent image corresponding to the image on the original 101 is formed on the photosensitive recording sheet 102. The photosensitive recording sheet 102 where the latent image has been formed is fed to the pressure-developing rollers 33 as the takeup roll 34 rotates. At the same time, the image reception sheet 103 is fed from the cassette unit 41 by an operation of the pickup roller 42 and thereby the image reception sheet 103 and the photosensitive recording sheet 102 are overlapped with each other and fed to the pressure-developing rollers 33. In the pressure-developing rollers 33, the image reception sheet 103 and the photosensitive recording sheet 102 are pressurized by the rollers 33a, 33a and thereby the latent image on the photosensitive recording sheet 102 is transferred and developed on the surface of the image reception sheet 103. After that, the image reception sheet 103 is ejected out of the device 1. On the other hand, the photosensitive recording sheet 102 where the image has been transferred and developed is taken up by the takeup roller 34 through the image erasing unit 35. When the photosensitive recording sheet 102 passes through the record erase unit 35, the roller 37 is contacted with the microcapsule layer including the microcapsules, not shown, of the photosensitive recording sheet 102 and the roller 37 is rotated in the reverse direction of the feed direction of the photosensitive recording sheet 102 by the drive motor. Thereby, a peel-off force required for peeling off the microcapsule layer works on the surface of the photosensitive recording sheet 102. Since the microcapsule layer is held on the base material by the water soluble binders, as described above, the water soluble binder can be easily resolved and removed by the water on the circumferential surface of the roller 37. Thereby, the negative image which has been formed by the exposed microcapsule layer on the photosensitive recording sheet 102 is erased. The microcapsule layer which was removed by the roller 37 is adhered on the circumferential surface of the roller 37. However, the microcapsule layer adhered is removed from the roller 37 by a blade 39a and collected in the water tank 39. Thus, the circumferential surface of the roller 37 is always kept clean. The photosensitive recording sheet 102 on which the negative image has been erased in the manner described above is taken up by the takeup roller 34 and the development operation is completed.

Figure 4:
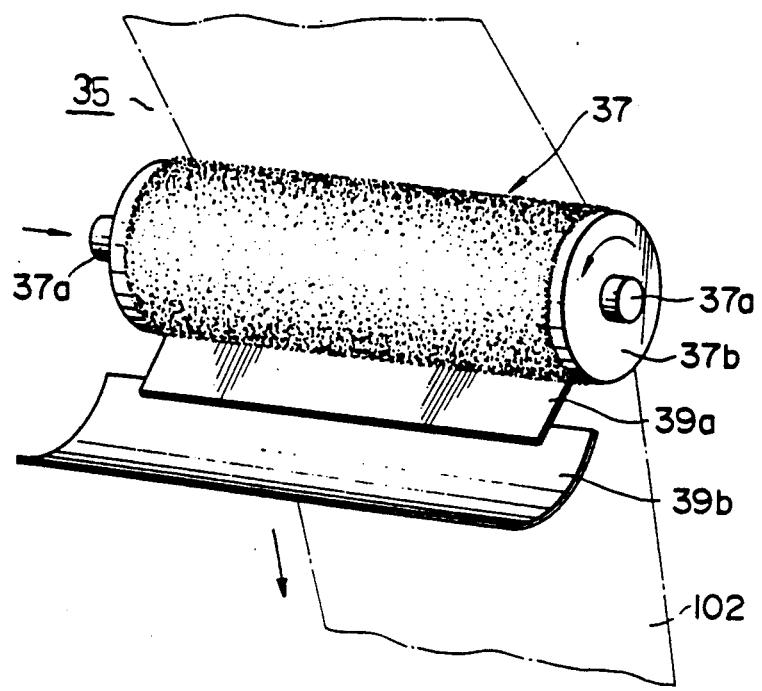
FIG. 4 is an enlarged perspective schematic illustrating an another image erasing unit incorporated in the image recording device of FIG. 1.
Figure 5:
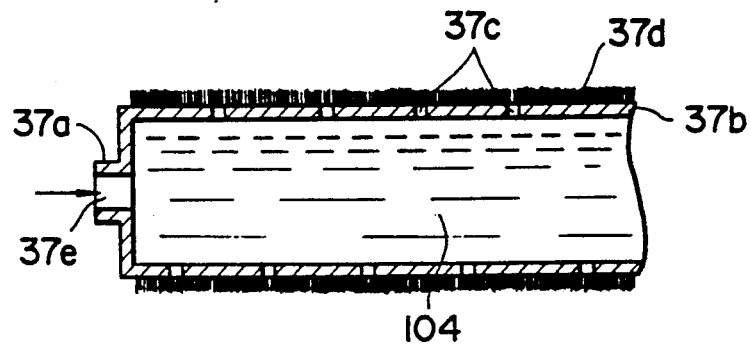
FIG. 5 is a sectional view of a roller employed in the erasing unit of FIG. 4.

FIG. 4 and 5 show an another example of the embodiment of the image erasing unit 35. FIG. 4 is an enlarged perspective schematic of the image erasing unit 35 and FIG. 5 is a sectional view of a roller 37 employed in the erasing unit of FIG. 4. In these figures, a large number of water injection holes 37c are disposed on a circumferential surface of a hollow roller 37b which can stores water therein. On the circumferential surface of the roller 37b, a brush 37d is disposed. Alternatively, a foaming urethane is wound around the roller 37b. In addition, at one end of the shaft 37a of the roller 37b, water supply holes 37e are disposed and water 104 is supplied into the inside of the roller 37b.

Further, it may be considered that, as similar to the above embodiment, a blade member 39a, for peeling off the adhesive substance on the circumferential surface of the roller 37. Below the blade 39a, a tray 39b for collecting the adhesive substances such as microcapsules which were peeled off is disposed. The image erasing operation on the photosensitive recording sheet 102 is in common with the embodiment described above.

Figure 6:
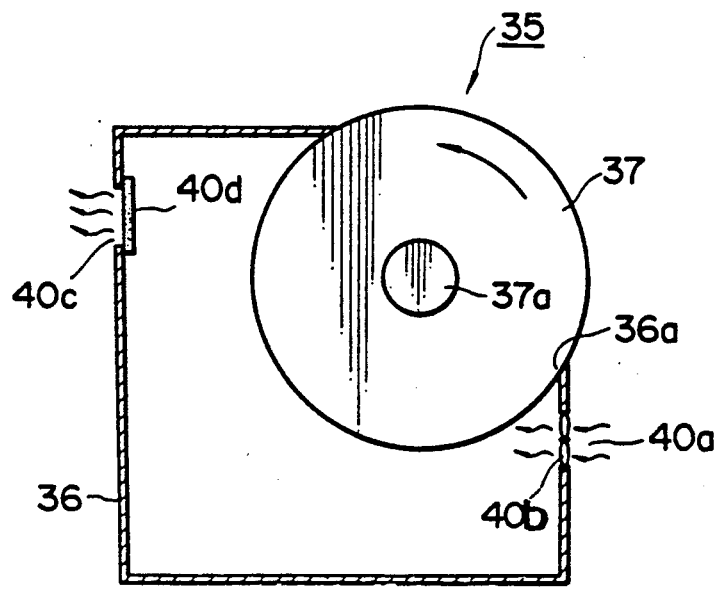
FIG. 6 is sectional schematic of a still another erasing unit incorporated in the image recording device of FIG. 1.

Furthermore, it may be considered that, as shown in FIG. 6, an abrasion roller 37 is disposed instead of the water absorption roller. The roller 37 is arranged to be contacted with the photosensitive recording sheet 102 in a predetermined pressure force required for scraping the microcapsule layer and driven to rotate in a reverse direction, as similar to the above embodiment, of the feed direction of the photosensitive recording sheet 102.

As shown in FIG. 6, the lower section of the unit case 36 is disposed as an abrasion chip collection box which stores abrasion chips such as microcapsules which were peeled off from the photosensitive recording sheet 102 by the roller 37. Below the roller 37 in the unit case 36, a suction opening 40a for the abrasive chips peeled from the photosensitive recording sheet 102 is disposed. At the suction opening 40a, a suction fan 40b is provided. The suction fan 40b is driven by a small drive motor, not shown. At the upper left portion of the unit case 36, an exhaust opening 40c is disposed. The exhaust opening 40c is also provided with a dust proof filter 40d. It is also possible to provide a slightly large opening 36a which exposes the abrasion roller 37, instead of the suction fan 40b and the suction opening 40a, for providing a suction unit to suck the abrasive chips, the suction unit is connected to the exhaust opening 40c to guide the sucked chips to the dust proof filter 40d. The guided chips are, thus, gradually collected in the unit case 36.

As the abrasion roller 37, a roller which is formed by diamond abrasive powder and alloy powder being dispersed in the binder, another roller where same type abrasive cloth or sheet is wound, or a wire brush-type roller can be used.

What is claimed is:

1. An image recording device, utilizing a recording medium which comprises a pair of sheets, which comprises:

first image forming means for forming a latent image on a predetermined surface of one of said sheets, said one sheet comprising a continuous-form recording sheet arranged to be fed at a predetermined speed, coated with a plurality of photo and pressure sensitive microcapsules each containing at least a dye-precursor and a component to change the rupture strength thereof when exposed to light on said predetermined surface;

second image forming means for forming a visible image corresponding to the latent image formed by said first image forming means on a predetermined surface of the other of said sheets, said other sheet comprising a cut-form developing sheet coated with a developer material which is reactable with said dye-precursor, on said predetermined surface;

said second image forming means comprises a pair of pressure roller members for pressurizing said pair of sheets in an overlapped state, in which each of said predetermined surface of said respective sheets is close in contact to each other; and, erase means for erasing any image remaining on said predetermined surface of said one of said sheets after the visible image is formed on said predetermined surface of said other of said sheets.

2. The image recording device according to claim 1 wherein said erase means comprises a roller member arranged to be brought into closer with said predetermined surface of said continuous-form recording sheet with a predetermined pressure force and to be driven to rotate at an another predetermined speed against a direction along which said continuous-form recording sheet is fed.

3. The image recording device according to claim 2 wherein a circumferential surface of said roller member is covered with an abrasive material for scraping the microcapsules having been placed on said predetermined surface of said continuous-form recording sheet.

4. The image recording device according to claim 2 wherein a circumferential surface of said roller member is moistened for cleaning off the microcapsules having been placed on said predetermined surface of said continuous-form recording sheet.

5. The image recording device according to claim 3 which further comprises a chamber unit for collecting the scraped microcapsules from said predetermined surface.

6. The image recording device according to claim 4 which further comprises a water tank unit for containing water in which a part of the circumferential surface of said roller member is dipped.

7. The image recording device according to claim 6 wherein at least the circumferential surface of said roller member is coated with a predetermined material selected from a group of materials comprising a foaming urethane, a foaming polypropylene, a foaming polyethylene, a foaming polyvinyl chloride, and a natural sponge.

8. The image recording device according to claim 4 wherein said roller member is designed to be capable of storing water therein, with a plurality of hole portions on the circumferential surface through which the water is percolated.

9. The image recording device according to claim 4 which further comprises a blade member arranged to be brought into contact with the circumferential surface of said roller member for scraping the microcapsules adhered to the circumferential surface of said roller member after cleaned off by the water from said predetermined surface of said continuous-form recording sheet.

10. An image recording process, utilizing a recording medium which comprises a pair of sheets, which comprises:

forming a latent image on a predetermined surface of one of said sheets;

transferring the formed latent image to a predetermined surface of the other of said sheets by pressurizing said pair of sheets in an overlapped state; and erasing any image formed on said predetermined surface of said one of said sheets.

11. The image recording process according to claim 10 wherein said one of said sheets comprises a continuous-form recording sheet, arranged to be fed in a predetermined speed, coated with a plurality of photo and pressure sensitive microcapsules each containing at least dye-precursor and a component to change the rupture strength thereof when exposed to light on said predetermined surface, and said other of said sheets comprises a cut-form developing sheet coated with a developer material which is reactable with said dye-precursor, on said predetermined surface, and wherein said two sheets ar pressurized by a pair of pressure roller members for pressurizing said pair of sheets in an overlapped state, in which each of said predetermined surface of said respective sheets is close in contact to each other.

12. The image recording process according to claim 11 wherein the image formed on said continuous-form recording sheet is erased by scraping the microcapsules having been located on said recording sheet.

13. The image recording process according to claim 12 wherein said microcapsules are peeled by a roller member arranged to be brought into closer with said predetermined surface of said continuous-form recording sheet with a predetermined pressure force and to be driven to rotate at an another predetermined speed against a direction along which said continuous-form recording sheet is fed.

14. The image recording process according to claim 13 wherein a circumferential surface of said roller member is covered with an abrasive material for scraping the microcapsules having been placed on said predetermined surface of said continuous-form recording sheet.

15. The image recording process according to claim 13 wherein a circumferential surface of said roller member is moistened for cleaning off the microcapsules having been placed on said predetermined surface of said continuous-form recording sheet.

16. An image recording device, utilizing a recording medium comprising a continuous-form recording sheet and a cut-form developing sheet, said continuous-form recording sheet being arranged to be fed at a predetermined speed, coated with a plurality of photo and pressure sensitive microcapsules each containing at least dye-precursor and a component to change the rupture strength thereof when exposed to light, and said cut-form developing sheet being arranged to be coated with a developer material which is reactable with said dye-precursor, which comprises:

expose means for exposing said continuous-form recording sheet to light in accordance with an optical image to be recorded for forming a latent image on a surface of said continuous-form recording sheet;

a pair of pressure-developing roller members, adapted to be brought into and out of contact with each other, for pressurizing said continuous-form recording sheet and said cut-form developing sheet in an overlapped state to develop a visible image in accordance with said latent image on said cut-form developing sheet; and peel means for peeling off the microcapsules from said continuous-form recording sheet after said continuous-form recording sheet and said cut-form developing sheet are pressurized by said pair of pressure-developing roller members.

17. The image recording device according to claim 16 wherein said peel means comprises a roller member arranged to be brought into closer with a surface of said continuous-form recording sheet on which said microcapsules are coated with a predetermined pressure force and to be driven to rotate at an another predetermined velocity against a direction along which said continuous-form recording sheet is fed.

18. The image recording device according to claim 17 wherein a circumferential surface of said roller member is covered with an abrasive material for scraping the microcapsules.

19. The image recording device according to claim 17 wherein a circumferential surface of said roller member is moistened for cleaning off the microcapsules.

* * * * *